(12) United States Patent
Iwase

(10) Patent No.: US 11,203,180 B2
(45) Date of Patent: Dec. 21, 2021

(54) GAS BARRIER FILM AND METHOD FOR PRODUCING GAS BARRIER FILM

(71) Applicant: FUJIFILM Corporation, Tokyo (JP)

(72) Inventor: Eijiro Iwase, Minamiashigara (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/658,372

(22) Filed: Oct. 21, 2019

(65) Prior Publication Data

US 2020/0048419 A1 Feb. 13, 2020

Related U.S. Application Data

(63) Continuation of application No. PCT/JP2018/014531, filed on Apr. 5, 2018.

(30) Foreign Application Priority Data

May 19, 2017 (JP) .............................. JP2017-099509

(51) Int. Cl.
*B32B 7/023* (2019.01)
*B32B 7/12* (2006.01)
(Continued)

(52) U.S. Cl.
CPC .............. *B32B 7/023* (2019.01); *B32B 7/12* (2013.01); *B32B 27/08* (2013.01); *B32B 27/322* (2013.01);
(Continued)

(58) Field of Classification Search
CPC .......... B32B 7/00–14; B32B 27/00–42; B32B 15/08–098; C09J 183/00–16;
(Continued)

(56) References Cited

U.S. PATENT DOCUMENTS

2011/0240211 A1 10/2011 Iwase
2012/0003448 A1* 1/2012 Weigel .................. B32B 7/02
428/212
(Continued)

FOREIGN PATENT DOCUMENTS

CN 102380978 A 3/2012
CN 102791476 A 11/2012
(Continued)

OTHER PUBLICATIONS

"3M™ Optically Clear Adhesive 8171 and 8172", 3M Company, (2016); pp. 1-3.*
(Continued)

*Primary Examiner* — Prashant J Khatri
(74) *Attorney, Agent, or Firm* — Birch, Stewart, Kolasch & Birch, LLP

(57) ABSTRACT

A gas barrier film has, in sequence, a support, an inorganic layer disposed on one surface side of the support, an adhesive layer disposed on a surface of the inorganic layer, and a resin layer disposed on a surface of the adhesive layer in which the adhesive layer has a thickness of 15 μm or less, and the adhesion strength between the inorganic layer and the adhesive layer is 21 N/25 mm or more and 60 N/25 mm or less. A method for producing a gas barrier film includes an inorganic layer deposition step and a bonding step in a vacuum.

18 Claims, 3 Drawing Sheets

(51) Int. Cl.
    *B32B 27/08*     (2006.01)
    *B32B 27/32*     (2006.01)
    *B32B 27/36*     (2006.01)
    *B32B 37/12*     (2006.01)
    *B32B 37/20*     (2006.01)
    *C08J 5/12*     (2006.01)
    *H01L 51/44*     (2006.01)
    *H01L 51/52*     (2006.01)
    *C23C 16/34*     (2006.01)
    *C23C 16/50*     (2006.01)

(52) U.S. Cl.
    CPC .............. *B32B 27/36* (2013.01); *B32B 37/12* (2013.01); *B32B 37/203* (2013.01); *C08J 5/125* (2013.01); *C23C 16/345* (2013.01); *C23C 16/50* (2013.01); *H01L 51/448* (2013.01); *H01L 51/5253* (2013.01); *B32B 2250/02* (2013.01); *B32B 2250/24* (2013.01); *B32B 2255/10* (2013.01); *B32B 2255/20* (2013.01); *B32B 2255/26* (2013.01); *B32B 2255/28* (2013.01); *B32B 2307/71* (2013.01); *B32B 2307/7244* (2013.01); *B32B 2307/7246* (2013.01); *B32B 2323/04* (2013.01); *B32B 2327/18* (2013.01); *B32B 2367/00* (2013.01); *B32B 2457/12* (2013.01); *C08J 2323/08* (2013.01); *C08J 2327/16* (2013.01); *C08J 2327/18* (2013.01); *C08J 2333/12* (2013.01); *C08J 2367/02* (2013.01); *C08J 2433/00* (2013.01)

(58) Field of Classification Search
    CPC ....... C09J 175/00–16; C09J 133/00–26; H01L 51/5253
    See application file for complete search history.

(56) References Cited

U.S. PATENT DOCUMENTS

| | | |
|---|---|---|
| 2012/0052272 A1 | 3/2012 | Iwase |
| 2012/0295116 A1 | 11/2012 | Kihara et al. |
| 2014/0000699 A1 | 1/2014 | Akaike et al. |
| 2015/0137108 A1 | 5/2015 | Iwase |
| 2015/0321455 A1 | 11/2015 | Asano et al. |
| 2016/0047036 A1 | 2/2016 | Iwase |
| 2016/0329522 A1 | 11/2016 | Hagihara et al. |
| 2017/0010399 A1 | 1/2017 | Yasui et al. |

FOREIGN PATENT DOCUMENTS

| | | |
|---|---|---|
| CN | 103415392 A | 11/2013 |
| CN | 104114361 A | 10/2014 |
| CN | 104507672 A | 4/2015 |
| CN | 104812570 A | 7/2015 |
| CN | 105849220 A | 8/2016 |
| CN | 105980892 A | 9/2016 |
| JP | 7-1642 A | 1/1995 |
| JP | 2011-207126 A | 10/2011 |
| JP | 2012-76287 A | 4/2012 |
| JP | 2013-533819 A | 8/2013 |
| JP | 2016-159510 A | 9/2016 |
| JP | 2016-204461 A | 12/2016 |

OTHER PUBLICATIONS

Machine translation of JP2016-204461. Retrieved Aug. 30, 2021.*
International Preliminary Report on Patentability and Written Opinion of the International Searching Authority (Forms PCT/IB/326, PCT/IB/373, and PCT/ISA/237) for International Application No. PCT/JP2018/014531, dated Nov. 28, 2019, with English translation of the Written Opinion.
International Search Report (Form PCT/ISA/210) for International Application No. PCT/JP2018/014531, dated Jun. 12, 2018, with English translation.
Chinese Office Action and Search Report, dated Jun. 9, 2021, for corresponding Chinese Application No. 201880030141.4, with an English translation of the Chinese Office Action.
Chinese Office Action and Search Report, dated Feb. 19, 2021, for corresponding Chinese Application No. 201880030141.4, with an English translation of the Chinese Office Action.
Chinese Office Action and English translation for Chinese Application No. 201880030141.4, dated Sep. 14, 2021.
Wang Yuehua et al., "Design, Preparation and Application of Films," p. 42, para 1-p. 46, para. 7, Chinese University of Technology Press, Oct. 31, 2016.

* cited by examiner

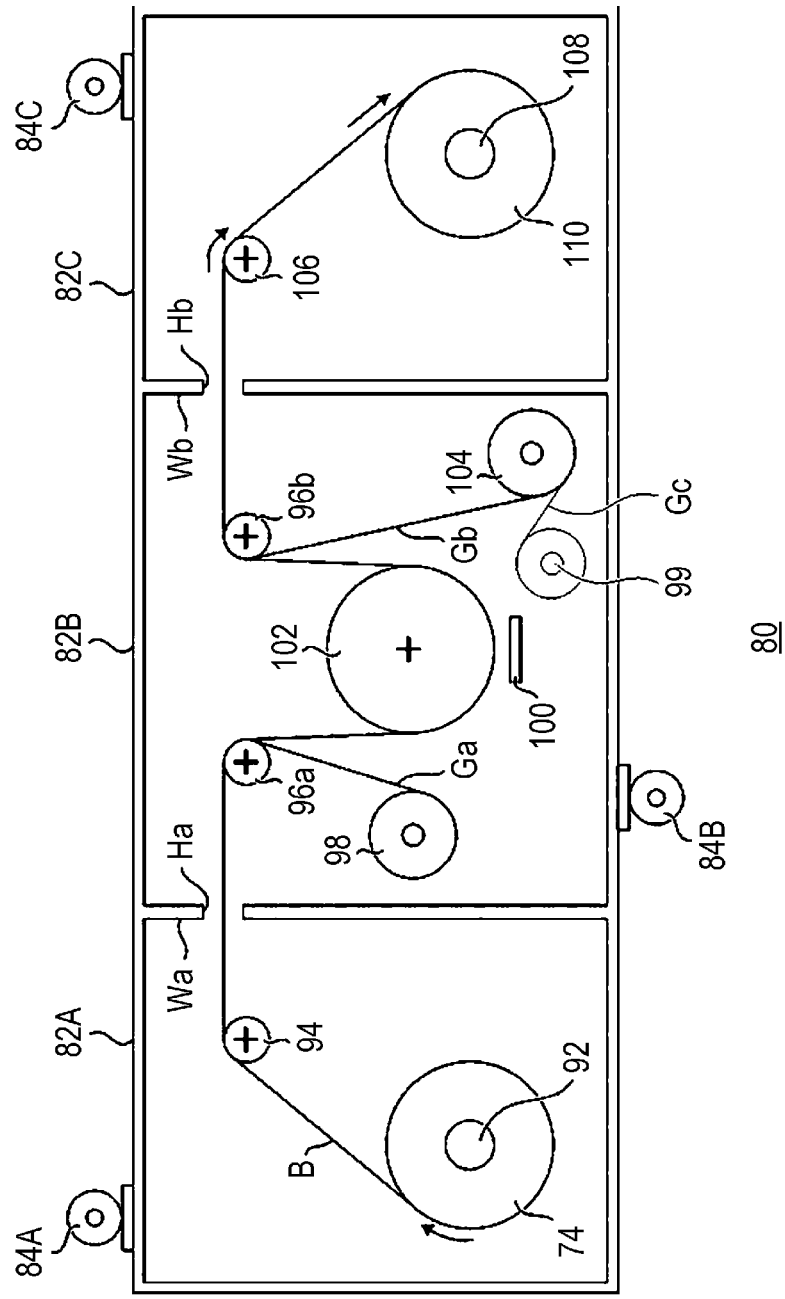

GAS BARRIER FILM AND METHOD FOR PRODUCING GAS BARRIER FILM

CROSS-REFERENCE TO RELATED APPLICATIONS

This application is a Continuation of PCT International Application No. PCT/JP2018/014531 filed on Apr. 5, 2018, which claims priority under 35 U.S.C § 119(a) to Japanese Patent Application No. 2017-099509 filed on May 19, 2017. Each of the above application(s) is hereby expressly incorporated by reference, in its entirety, into the present application.

BACKGROUND OF THE INVENTION

1. Field of the Invention

The present invention relates to a gas barrier film and a method for producing the gas barrier film.

2. Description of the Related Art

There are many products that protect materials vulnerable to oxygen and water using a gas barrier film.

For example, in organic electroluminescence (EL), flexibility is imparted by replacing a known glass substrate with a gas barrier film. By using such a gas barrier film having flexibility as an alternative to glass substrates, the added value of products is improved. Therefore, gas barrier films that have flexibility and exhibit good gas barrier properties are promising.

In recent years, solar cells have been actively studied in the field of energy from the viewpoint of, for example, environmental protection. Specifically, many studies on, for example, Cu—In—Ga—Se (CIGS)-based solar cells and organic thin film solar cells have been conducted.

Gas barrier films are used for such industrial equipment. For example, the replacement of a glass portion of a solar cell module (solar cell panel) with a gas barrier film imparts flexibility and reduces the weight. Gas barrier films can also be applied to construction materials. Such a gas barrier film is promising because of its wide applicability.

A film having a structure in which an inorganic layer that mainly exhibits gas barrier properties is disposed on a support formed of a resin film has been proposed as such a gas barrier film. This inorganic layer is easily damaged. If the inorganic layer is damaged, the barrier properties deteriorate. Therefore, an organic layer serving as an overcoat layer for protecting the inorganic layer is sometimes disposed on the inorganic layer.

For example, JP2011-207126A discloses that an organic layer (resin layer) is formed on an inorganic layer by a coating method. This organic layer has a function of protecting the inorganic layer.

JP2016-204461A discloses that a protective film formed of a support (resin layer) and an adhesive layer is laminated on an inorganic layer to protect the inorganic layer.

SUMMARY OF THE INVENTION

As described above, such a gas barrier film is used for, for example, organic EL and solar cells.

In organic EL that uses a gas barrier film, light emitted from an organic EL element and transmitted through the gas barrier film is visually observed. In solar cells that use a gas barrier film, light transmitted through the gas barrier film enters a solar cell and power is generated.

Therefore, the gas barrier film used for organic EL and solar cells is required to have high transparency (light-transmitting property) in addition to good gas barrier properties.

However, when an organic layer (resin layer) is directly formed on an inorganic layer, the material for the organic layer that can be used to ensure adhesiveness between the inorganic layer and the organic layer is limited. To increase the light transmittance in a gas barrier film, the difference in refractive index between layers is desirably decreased. However, if the material is limited, a material having an appropriate refractive index cannot be selected, which sometimes makes it difficult to increase the light transmittance.

To ensure the adhesiveness between the inorganic layer and the organic layer or to ensure the protection of the inorganic layer by the organic layer, the thickness of the organic layer needs to be increased. However, a thick organic layer may decrease the light transmittance.

When the resin layer is bonded onto the inorganic layer with an adhesive layer disposed therebetween, there is no need to consider the adhesiveness with the inorganic layer. Therefore, a material having, for example, a preferred transmitting property and a preferred refractive index can be selected as a material for the resin layer. However, the thickness of the adhesive layer needs to be increased to ensure the adhesiveness between the adhesive layer and the inorganic layer. Furthermore, since two layers of the resin layer and the adhesive layer are required, the thickness of the entire gas barrier film is further increased. If the thickness of the adhesive layer is large and if the thickness of the entire gas barrier film is large, the light transmittance may be decreased.

In view of the above problems, it is an object of the present invention to provide a gas barrier film which has an inorganic layer and in which the adhesion strength between the inorganic layer and the adhesive layer is high and the light transmittance is high, and a method for producing the gas barrier film.

As a result of thorough studies conducted to achieve the above object, the present inventors have found that the above object can be achieved by satisfying the following and have completed the present invention. That is, a gas barrier film has, in sequence, a support, an inorganic layer disposed on one surface side of the support, an adhesive layer disposed on a surface of the inorganic layer, and a resin layer disposed on a surface of the adhesive layer. The adhesive layer has a thickness of 15 μm or less, and the adhesion strength between the inorganic layer and the adhesive layer is 21 N/25 mm or more and 60 N/25 mm or less.

In other words, the present inventors have found that the above object can be achieved by the following configurations.

(1) A gas barrier film has, in sequence, a support, an inorganic layer disposed on one surface side of the support, an adhesive layer disposed on a surface of the inorganic layer, and a resin layer disposed on a surface of the adhesive layer, wherein the adhesive layer has a thickness $d1$ of 15 μm or less, and an adhesion strength between the inorganic layer and the adhesive layer is 21 N/25 mm or more and 60 N/25 mm or less.

(2) In the gas barrier film according to (1), a refractive index $n2$ of the resin layer and a refractive index $n3$ of the support satisfy a relationship of $n2<n3$.

(3) In the gas barrier film according to (1) or (2), a thickness d2 of the resin layer and the thickness d1 of the adhesive layer satisfy a relationship of d1<d2.

(4) In the gas barrier film according to any one of (1) to (3), a thickness d3 of the support and the thickness d1 of the adhesive layer satisfy a relationship of d1<d3.

(5) In the gas barrier film according to any one of (1) to (4), the gas barrier film has a haze of 3% or less.

(6) In the gas barrier film according to any one of (1) to (5), the refractive index n2 of the resin layer is 1.38 or more and 1.65 or less.

(7) In the gas barrier film according to any one of (1) to (6), the resin layer contains a fluorocarbon resin.

(8) In the gas barrier film according to any one of (1) to (7), the adhesive layer includes at least one of acrylic, silicone, or urethane, and a refractive index n1 of the adhesive layer is 1.38 or more and 1.65 or less.

(9) The gas barrier film according to any one of (1) to (8) has an underlayer between the support and the inorganic layer.

(10) In the gas barrier film according to any one of (1) to (9), at least one of the adhesive layer, the resin layer, or the support contains an ultraviolet absorber.

(11) A method for producing a gas barrier film includes, in a vacuum, an inorganic layer deposition step of depositing an inorganic layer on one surface side of a support by plasma chemical vapor deposition (CVD) and, immediately after the inorganic layer deposition step, a bonding step of bonding a laminate film having an adhesive layer and a resin layer onto the inorganic layer such that the adhesive layer and the inorganic layer face each other.

(12) In the method for producing a gas barrier film according to (11), the inorganic layer deposition step and the bonding step are performed in a vacuum while a long support is transported in a longitudinal direction.

(13) The method for producing a gas barrier film according to (11) or (12) further includes an underlayer formation step of forming an underlayer on the support, wherein in the inorganic layer deposition step, an inorganic layer is deposited on a surface of the underlayer by plasma CVD.

(14) In the method for producing a gas barrier film according to any one of (11) to (13), the laminate film further has a release film disposed on a surface thereof on the adhesive layer side and, in the bonding step, the laminate film is bonded onto the inorganic layer with the release film being separated.

The present invention can provide a gas barrier film which has an inorganic layer and in which the adhesion strength between the inorganic layer and the adhesive layer is high and the light transmittance is high, and a method for producing the gas barrier film.

BRIEF DESCRIPTION OF THE DRAWINGS

FIG. 4 schematically illustrates an example of an inorganic layer-forming apparatus.

DESCRIPTION OF THE PREFERRED EMBODIMENTS

Hereafter, a gas barrier film and a method for producing a gas barrier film according to embodiments of the present invention will be described in detail based on a gas barrier film 10 according to a first embodiment and a gas barrier film 12 according to a second embodiment.

Figure 1:
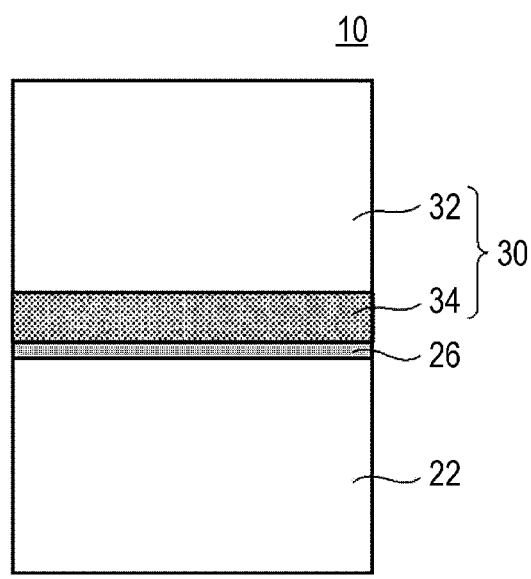
FIG. 1 is a sectional view schematically illustrating an example of a gas barrier film according to an embodiment of the present invention.

FIG. 1 illustrates a gas barrier film 10 according to a first embodiment. The gas barrier film 10 has a support 22, an inorganic layer 26 disposed on one surface (upper surface in FIG. 1) of the support 22, and a laminate film 30 having an adhesive layer 34 and a resin layer 32.

Figure 2:
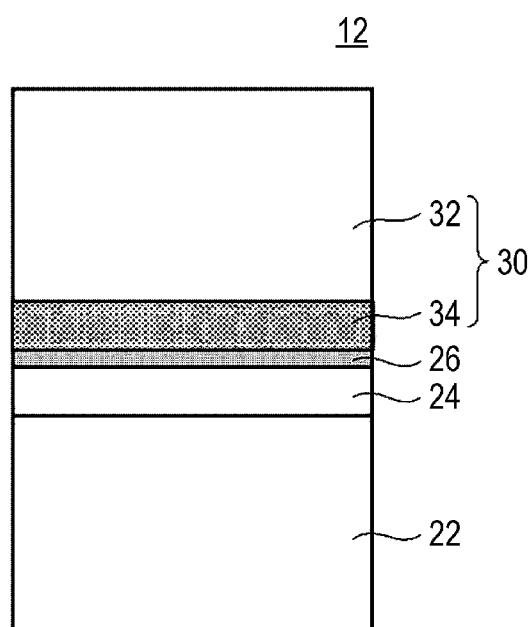
FIG. 2 is a sectional view schematically illustrating another example of the gas barrier film according to an embodiment of the present invention.

FIG. 2 illustrates a gas barrier film 12 according to a second embodiment. The gas barrier film 12 has a support 22, an underlayer 24 disposed on one surface (upper surface in FIG. 2) of the support 22, and an inorganic layer 26. The gas barrier film 12 further has, on the inorganic layer 26, a laminate film 30 having an adhesive layer 34 and a resin layer 32.

The layer structures of the gas barrier films according to embodiments of the present invention are not limited thereto and may be appropriately changed. For example, the gas barrier films may have two or more pairs of underlayers 24 and inorganic layers 26.

Herein, the thickness of the adhesive layer 34 is 15 μm or less and the adhesion strength between the inorganic layer 26 and the adhesive layer 34 is 21 N/25 mm or more and 60 N/25 mm or less. When the adhesive layer 34 has a small thickness of 15 μm or less, the reflection at an interface between the adhesive layer 34 and another layer can be suppressed even if the difference in refractive index between the adhesive layer 34 and the other layer is large. Thus, the light transmittance can be increased. When the adhesion strength between the inorganic layer 26 and the adhesive layer 34 is 21 N/25 mm or more, the separation of the adhesive layer 34 (laminate film 30) from the inorganic layer 26 can be suppressed and thus the inorganic layer 26 can be appropriately protected. An excessive increase in the adhesion strength between the inorganic layer 26 and the adhesive layer 34 causes troubles such as deformation of the gas barrier film. The deformation of the gas barrier film may cause breaking of the inorganic layer. Therefore, by setting the adhesion strength between the inorganic layer 26 and the adhesive layer 34 to 60 N/25 mm or less, the deformation of the gas barrier film is suppressed and thus the inorganic layer 26 can be appropriately protected.

In general, when the thickness of the adhesive layer 34 is set to 15 μm or less, it is difficult to achieve an adhesion strength of 21 N/25 mm or more between the adhesive layer 34 and the inorganic layer 26. In contrast, in the present invention, the thickness of the adhesive layer 34 can be set to 15 μm or less and the adhesion strength between the adhesive layer 34 and the inorganic layer 26 can be set to 21 N/25 mm or more by producing the gas barrier film by a production method described later.

From the viewpoint of, for example, appropriately protecting the inorganic layer 26, the adhesion strength between the inorganic layer 26 and the adhesive layer 34 is preferably 21 N/25 mm or more and 60 N/25 mm or less and more preferably 22 N/25 mm or more and 50 N/25 mm or less.

The adhesion strength can be measured based on the measurement of peel adhesion from a test plate at 180° in JIS Z0237 (2009).

When the adhesive layer 34 has a thickness d1, the resin layer 32 has a thickness d2, and the support 22 has a thickness d3, a relationship of d1<d2 is preferably satisfied and a relationship of d1<d3 is preferably satisfied. When the thickness of the adhesive layer 34 is smaller than the thickness of the resin layer 32 and the thickness of the support 22, an increase in the reflectivity at interfaces of the adhesive layer 34 can be suppressed, which can increase the light transmittance.

Support 22

The support 22 may be a publicly known sheet-shaped object used as a support for various gas barrier films and various laminate functional films. The thermal deformation of the support 22 is preferably as small as possible.

Specifically, the support 22 is preferably a resin film. Any material is used for the resin film as long as the gas barrier film 10 is self-supported.

Examples of the resin film include films of polyethylene (PE), polyethylene naphthalate (PEN), polyamide (PA), polyethylene terephthalate (PET), polyvinyl chloride (PVC), polyvinyl alcohol (PVA), polyacrylonitrile (PAN), polyimide (PI), optically transparent polyimide, polymethyl methacrylate resin (PMMA), polycarbonate (PC), polyacrylate, polymethacrylate, polypropylene (PP), polystyrene (PS), acrylonitrile-butadiene-styrene copolymers (ABS), cyclic olefin copolymers (COC), cycloolefin polymers (COP), and triacetyl cellulose (TAC).

The thickness of the support 22 can be appropriately set in accordance with, for example, the applications and the materials. The thickness of the support 22 is preferably 5 to 150 μm and more preferably 10 to 100 μm from the viewpoints of achieving a sufficient mechanical strength of the gas barrier film 10, decreasing the weight and thickness of the gas barrier film 10, and imparting flexibility to the gas barrier film 10.

The support 22 may have a functional layer on its surface. Examples of the functional layer include a protective layer, an adhesive layer, a light reflection layer, an antireflection layer, a light-shielding layer, a planarizing layer, a cushioning layer, and a stress relaxation layer.

Underlayer 24

The underlayer 24 is disposed on the support 22.

The underlayer 24 is formed of, for example, an organic compound obtained by polymerizing (crosslinking, curing) monomers or oligomers.

The underlayer 24 is disposed in a preferred embodiment. The underlayer 24 is a layer that eliminates the irregularities of the surface of the support 22 and buries foreign matter or the like attached to the surface of the support 22.

The gas barrier film 12 illustrated in FIG. 2 has one pair of the underlayer 24 and the inorganic layer 26. As the number of pairs of the underlayer and the inorganic layer increases, good gas barrier properties are achieved, but the gas barrier film thickens.

Underlayer-Forming Composition

The underlayer 24 is formed by, for example, curing an underlayer-forming composition. The underlayer-forming composition contains an organic compound such as a thermoplastic resin or an organosilicon compound. Examples of the thermoplastic resin include polyester, (meth)acrylic resin, methacrylic acid-maleic acid copolymers, polystyrene, transparent fluorocarbon resin, polyimide, fluorinated polyimide, polyamide, polyamide-imide, polyether imide, cellulose acylate, polyurethane, polyether ether ketone, polycarbonate, alicyclic polyolefin, polyarylate, polyethersulfone, polysulfone, fluorene ring-modified polycarbonate, alicyclic-modified polycarbonate, fluorene ring-modified polyester, and acrylic compounds. An example of the organosilicon compound is polysiloxane. The underlayer 24 may contain one organic compound or two or more organic compounds.

The underlayer-forming composition preferably contains a polymer of a radically curable compound and/or a cationically curable compound having an ether group from the viewpoints of high strength of the underlayer 24 and glass transition temperature.

The underlayer-forming composition preferably contains a (meth)acrylic resin containing, as a main component, a polymer obtained from monomers or oligomers of (meth) acrylates from the viewpoint of decreasing the refractive index of the underlayer 24. By decreasing the refractive index of the underlayer 24, the transparency is improved and the light transmittance is increased.

The underlayer-forming composition more preferably contains a (meth)acrylic resin containing, as a main component, a polymer obtained from monomers or oligomers of di- or higher functional (meth)acrylates such as dipropylene glycol di(meth)acrylate (DPGDA), trimethylolpropane tri (meth)acrylate (TMPTA), and dipentaerythritol hexa(meth) acrylate (DPHA) and particularly preferably contains a (meth)acrylic resin containing, as a main component, a polymer obtained from monomers or oligomers of tri- or higher functional (meth)acrylates. These (meth)acrylic resins may be used in combination. The main component refers to a component having the highest mass content among all components contained.

The underlayer-forming composition preferably contains, for example, an organic solvent, an organic compound (e.g., a monomer, a dimer, a trimer, an oligomer, and a polymer), a surfactant, and a silane coupling agent.

The underlayer 24 may also contain a polymer (polycondensate) of an alkoxysilane.

As is generally known, a polymer of an alkoxysilane has an "—O—Si—O—" bond formed through hydrolysis and polymerization (polycondensation) of the alkoxysilane. Therefore, the underlayer 24 containing the polymer of an alkoxysilane has a very high density and is hard. Such an underlayer 24 is not easily damaged even when transported, for example.

The underlayer 24 containing the polymer of an alkoxysilane is formed using an underlayer-forming composition obtained by dissolving an alkoxysilane in a solvent and, if necessary, adding a curing agent, a surfactant, and the like. In the underlayer-forming composition that uses an alkoxysilane, water can be used as a solvent because the alkoxysilane is soluble in water. Therefore, there is no need to use an organic solvent and thus such an underlayer-forming composition can be used in a film-forming apparatus without explosion-proofness. By using water for the underlayer-forming composition, the hydrolysis and polymerization of an alkoxysilane suitably proceed.

The hydrolysis and polymerization of an alkoxysilane proceed through heating. Therefore, the alkoxysilane is homogeneously polymerized (cured) at any position in a thickness direction by applying the underlayer-forming composition and then heating the whole coating film. In the thus-obtained underlayer, the residual amount of an unreacted alkoxysilane is very small. The underlayer-forming composition that uses water as a solvent also has an advantage in terms of antipollution.

The alkoxysilane is not limited, and various publicly known alkoxysilanes can be used. Note that silazanes are also regarded as alkoxysilanes.

Specifically, the alkoxysilane is, for example, a compound represented by general formula (1) below, $$R^1_a Si(OR^2)_{4-a} \qquad \text{General Formula (1)}$$

where $R^1$ represents an organic group having 1 to 10 carbon atoms, $R^2$ each represent an alkyl group having 1 to 3 carbon atoms, and a represents 0 or 1.

Examples of the alkoxysilane include methyltrimethoxysilane, dimethyldimethoxysilane, phenyltrimethoxysilane, methyltriethoxysilane, dimethyldiethoxysilane, phenyltriethoxysilane, n-propyltrimethoxysilane, n-propyltriethoxysilane, isobutyltrimethoxysilane, isobutyltriethoxysilane, cyclohexylmethyldimethoxysilane, hexyltrimethoxysilane, hexyltriethoxysilane, octyltriethoxysilane, decyltrimethoxysilane, 3-glycidoxypropyltriethoxysilane, tetraethoxysilane (TEOS), and hexamethyldisilazane.

Among them, a trifunctional to hexafunctional alkoxysilane is preferably used, and tetraethoxysilane and 3-glycidoxypropyltriethoxysilane are more preferably used.

The alkoxysilane is preferably a compound having no radically polymerizable group. If the alkoxysilane has a radically polymerizable group, the radically polymerizable group polymerized near the surface of the coating film inhibits the polymerization inside the coating film. Consequently, the alkoxysilane may be unevenly cured in the thickness direction. If the inorganic layer 26 is formed on such an underlayer 24, the underlayer 24 is etched by plasma and an unreacted radically polymerizable group is partly exposed, which may form defects that impair gas barrier properties.

A plurality of alkoxysilanes may be used in combination. For example, tetraethoxysilane and 3-glycidoxypropyltriethoxysilane are used in combination.

When a plurality of alkoxysilanes are used in combination, at least one of the alkoxysilanes is preferably an alkoxysilane having a straight chain (that may have a side chain) with 3 or more carbon atoms. The alkoxysilane having a straight chain with 3 or more carbon atoms is preferably used because curling of the gas barrier film can be appropriately prevented and polymerizability can be sufficiently ensured.

The thickness of the underlayer 24 can be appropriately set in accordance with the components contained in the underlayer-forming composition and the support 22 used. The thickness of the underlayer 24 is preferably 0.5 to 5 μm and more preferably 1 to 3 μm. When the underlayer 24 has a thickness of 0.5 μm or more, the surface of the underlayer 24 can be planarized by eliminating the irregularities of the surface of the support 22 and burying foreign matter attached to the surface of the support 22. When the underlayer 24 has a thickness of 5 μm or less, cracking of the underlayer 24 and curling of the gas barrier film 12 can be suppressed.

When a plurality of underlayers 24 are disposed, the thicknesses of the underlayers 24 may be the same or different.

The underlayer 24 can be formed by a publicly known method. Specifically, the underlayer 24 can be formed by applying the underlayer-forming composition and drying the resulting coating film. The underlayer 24 may be further optionally irradiated with ultraviolet rays to polymerize (crosslink) the organic compound in the underlayer-forming composition.

The underlayer 24 can be formed by a so-called "roll-to-roll process". Hereafter, the "roll-to-roll process" may also be referred to as "RtoR". RtoR is a production process in which a long sheet to be subjected to film formation is unwound from a roll of the long sheet to be subjected to film formation and is subjected to film formation while being transported in the longitudinal direction, and the sheet having been subjected to film formation is wound into a roll. By using RtoR, high productivity and high production efficiency are achieved.

Inorganic Layer 26

The inorganic layer 26 is a thin film containing an inorganic compound and is disposed on one surface side of the support. The inorganic layer 26 exhibits gas barrier properties.

The inorganic layer 26 is more properly formed by being disposed on the surface of the underlayer 24. The surface of the support 22 has a region in which an inorganic compound is not easily deposited, such as the irregularities of the surface and the hidden side of foreign matter. By disposing the underlayer 24 on the support 22, the region in which an inorganic compound is not easily deposited is covered. Therefore, the inorganic layer 26 can be formed on the entire surface of the support 22 without forming gaps.

The inorganic compound is a metal compound. Specific examples of the inorganic compound include metal oxides such as aluminum oxide, magnesium oxide, tantalum oxide, zirconium oxide, titanium oxide, and indium tin oxide (ITO); metal nitrides such as aluminum nitride; metal carbides such as aluminum carbide; silicon oxides such as silicon oxide, silicon oxynitride, silicon oxycarbide, and silicon oxycarbonitride; silicon nitrides such as silicon nitride and silicon carbonitride; silicon carbides such as silicon carbide; hydrides of the foregoing compounds; mixtures of two or more of the foregoing compounds; and hydrogen-containing products of the foregoing compounds.

From the viewpoints of high transparency and good gas barrier properties, the inorganic layer 26 is preferably formed of silicon nitride, silicon oxide, silicon oxynitride, aluminum oxide, or a mixture of two or more of the foregoing compounds. The inorganic layer 26 is more properly formed of silicon nitride.

The thickness of the inorganic layer 26 can be appropriately set in accordance with the type of inorganic compound such that gas barrier properties are exhibited. The thickness of the inorganic layer 26 is preferably 10 to 200 nm, more preferably 15 to 100 nm, and particularly preferably 20 to 75 nm. When the inorganic layer 26 has a thickness of 10 nm or more, sufficient gas barrier properties can be stably exhibited. The inorganic layer 26 is generally brittle. If the thickness of the inorganic layer 26 is excessively large, cracking or separation may be caused. By setting the thickness of the inorganic layer 26 to 200 nm or less, cracking or separation can be prevented.

Since the inorganic layer 26 formed of silicon nitride has a very high density, excellent gas barrier properties are achieved even when the inorganic layer 26 has a thickness of, for example, about 30 nm. When the inorganic layer 26 is formed of silicon nitride, a high-quality thin gas barrier film having high transparency and high flexibility in addition to good gas barrier properties is provided.

When a plurality of inorganic layers 26 are disposed, the thicknesses of the inorganic layers 26 may be the same or different. Each of the inorganic layers 26 can be formed using the same inorganic layer-forming material.

The inorganic layer 26 can be formed by a publicly known method. Specifically, the inorganic layer 26 can be formed by plasma chemical vapor deposition (CVD) such as capacitively coupled plasma (CCP)-CVD or inductively coupled plasm (ICP)-CVD.

The inorganic layer 26 is preferably formed by RtoR.

In the gas barrier film according to an embodiment of the present invention, a mixture layer containing components of both the underlayer 24 and the inorganic layer 26 may be disposed between the inorganic layer 26 and the underlayer 24 that serves as a base of the inorganic layer 26.

Laminate Film 30

The laminate film 30 has a resin layer 32 and an adhesive layer 34 and is disposed on the inorganic layer 26 such that the adhesive layer 34 faces the inorganic layer 26. The laminate film 30 preferably further has a release film disposed on its surface on the adhesive layer 34 side.

Resin Layer 32

The resin layer 32 is a layer that is formed of a resin material and that protects the inorganic layer 26.

Non-limiting examples of the material for the resin layer 32 include resins such as tetrafluoroethylene-ethylene copolymers (ETFE), polytetrafluoroethylene (PTFE), polyvinylidene fluoride (PVDF), ethylene-chlorotrifluoroethylene (ECTFE), polyethylene terephthalate (PET), polyethylene (PE), polymethyl methacrylate (PMMA), ethylene vinyl alcohol (EVA), polypropylene (PP), triacetyl cellulose (TAC). The material for the resin layer 32 may be a combination of these resin materials.

From the viewpoints of increasing the light transmittance and adjusting the refractive index to a preferred value, the material for the resin layer is preferably ETFE, PTFE, PVDF, or ECTFE.

The material for the resin layer 32 is preferably a material containing a fluorocarbon resin, such as ETFE, PTFE, PVDF, or ECTFE. When the resin layer 32 contains a fluorocarbon resin, the lubricity of the surface of the resin layer 32 can be improved. Therefore, for example, when the gas barrier film is produced by RtoR and the produced gas barrier film is wound into a roll, the frictional force between the top surface of the resin layer 32 and the back surface of the support 22 can be reduced, which can suppress, for example, deformation of the gas barrier film that has been wound into a roll.

The thickness of the resin layer 32 can be appropriately set in accordance with, for example, the applications and the materials. The thickness of the resin layer 32 is preferably 5 to 150 μm and more preferably 10 to 100 μm from the viewpoints of sufficiently protecting the inorganic layer 26, decreasing the weight and thickness of the gas barrier film, and imparting flexibility to the gas barrier film.

The refractive index n2 of the resin layer 32 and the refractive index n3 of the support preferably satisfy n2<n3. When the refractive index of the resin layer 32 is lower than that of the support, the light transmittance can be further increased.

The refractive index of the resin layer 32 is preferably 1.38 or more and 1.65 or less and more preferably 1.38 or more and 1.55 or less. When the resin layer 32 has a refractive index within the above range, the difference in refractive index between the resin layer 32 and the support 22 and between the resin layer 32 and the air decreases. Thus, an increase in the reflectivity at interfaces of the resin layer 32 can be suppressed, which can increase the light transmittance.

Adhesive Layer 34

The adhesive layer 34 is used to bond the resin layer 32 and the inorganic layer 26.

The material for the adhesive layer 34 is not limited, and various publicly known adhesive materials are available. The adhesive layer preferably contains at least one of acrylic, silicone, or urethane. The adhesive layer can be formed using, for example, an acrylic adhesive, a silicone adhesive, or a urethane adhesive.

From the viewpoint of optical properties such as retardation and haze, the material for the adhesive layer 34 is preferably acrylic, silicone, or urethane.

The acrylic adhesive is, for example, SK-Dyne series (manufactured by Soken Chemical & Engineering Co., Ltd.).

The thickness of the adhesive layer 34 is preferably small from the viewpoint of light transmittance and is preferably large from the viewpoint of adhesion strength. For some types of adhesive layers 34, if the adhesive layer 34 is excessively thick, the inorganic layer may be broken because of aggregation when the adhesive layer 34 is cured. In this regard, the thickness of the adhesive layer 34 is preferably small. Therefore, from the viewpoint of achieving high light transmittance and high adhesion strength, the thickness of the adhesive layer 34 is 15 μm or less, preferably 50 nm or more and 15 μm or less, more preferably 0.1 or more and 10 μm or less, and further preferably 0.5 μm or more and 5 μm or less.

As described later, if the thickness of the adhesive layer 34 is excessively large in the production of the gas barrier film according to an embodiment of the present invention by RtoR, the roll diameter of a roll obtained by winding the produced gas barrier film excessively increases. This requires use of a larger vacuum chamber, which increases the size of equipment.

If the thickness of the adhesive layer 34 is excessively large when the produced gas barrier film is wound into a roll, a shearing force is exerted to the gas barrier film, which may deform the gas barrier film.

Furthermore, if the thickness of the adhesive layer 34 is excessively large, moisture (outgassing) and the like contained in the adhesive layer 34 are released, which may adversely affect a member sealed with the gas barrier film.

Therefore, the thickness of the adhesive layer 34 is preferably within the above range from the viewpoints of, for example, decreasing the size of equipment, suppressing deformation due to shear, and reducing outgassing.

The thickness of the adhesive layer 34 is preferably smaller than those of the resin layer 32 and the support 22.

The refractive index of the adhesive layer 34 is preferably 1.38 or more and 1.65 or less and more preferably 1.38 or more and 1.55 or less. By adjusting the refractive index of the adhesive layer 34 within the above range, the difference in refractive index between the adhesive layer 34 and the support 22 and between the adhesive layer 34 and the resin layer 32 is decreased. Thus, an increase in the reflectivity at interfaces of the adhesive layer 34 can be suppressed, which can increase the light transmittance.

Herein, at least one of the adhesive layer 34, the resin layer 32, or the support 22 preferably contains an ultraviolet absorber. The adhesive layer 34, the resin layer 32, and the support 22 preferably contain an ultraviolet absorber.

The ultraviolet absorber contained in these layers can suppress the deterioration, due to ultraviolet rays, of a barrier layer and the support on which the barrier layer is formed.

The gas barrier film according to an embodiment of the present invention preferably has high light transmittance and low haze. Specifically, the total light transmittance of the gas barrier film is preferably 88% or more and more preferably 90% or more. The haze of the gas barrier film is preferably 3.0% or less, more preferably 1.5% or less, and further preferably 1.0% or less.

The total light transmittance of the gas barrier film can be measured in conformity with JIS K7361 (1997) using a commercially available measuring instrument such as NDH 5000 or SH-7000 manufactured by NIPPON DENSHOKU INDUSTRIES Co., Ltd.

The haze of the gas barrier film can be measured in conformity with JIS K7136 (2000) using a commercially available measuring instrument such as NDH 5000 manufactured by NIPPON DENSHOKU INDUSTRIES Co., Ltd.

Method for Producing Gas Barrier Film

Next, a method for producing a gas barrier film according to an embodiment of the present invention will be described.

The method for producing a gas barrier film according to an embodiment of the present invention is a method including, in a vacuum, an inorganic layer deposition step of depositing an inorganic layer on one surface of a support by plasma CVD, and immediately after the inorganic layer deposition step, a bonding step of bonding a laminate film having an adhesive layer and a resin layer onto the inorganic layer such that the adhesive layer and the inorganic layer face each other.

In the present invention, the phrase "a bonding step is performed immediately after the inorganic layer deposition step" means that a bonding step is performed after the inorganic layer deposition step without performing other steps.

For example, preferably, the inorganic layer deposition step and the bonding step are continuously performed in a vacuum while a long support is transported in a longitudinal direction without performing other steps such as a step of bonding a protective film onto the inorganic layer and a step of separating the protective film bonded onto the inorganic layer. In such a method for producing a gas barrier film, RtoR can be preferably used.

The method for producing a gas barrier film according to an embodiment of the present invention preferably further includes, before the inorganic layer deposition step, an underlayer formation step of forming an underlayer on the support. In the inorganic layer deposition step, an inorganic layer is preferably formed on the underlayer formed in the underlayer formation step.

Hereafter, a preferred method for producing the gas barrier film 12 illustrated in FIG. 2 will be described with reference to FIG. 3 and FIG. 4.

Figure 3:
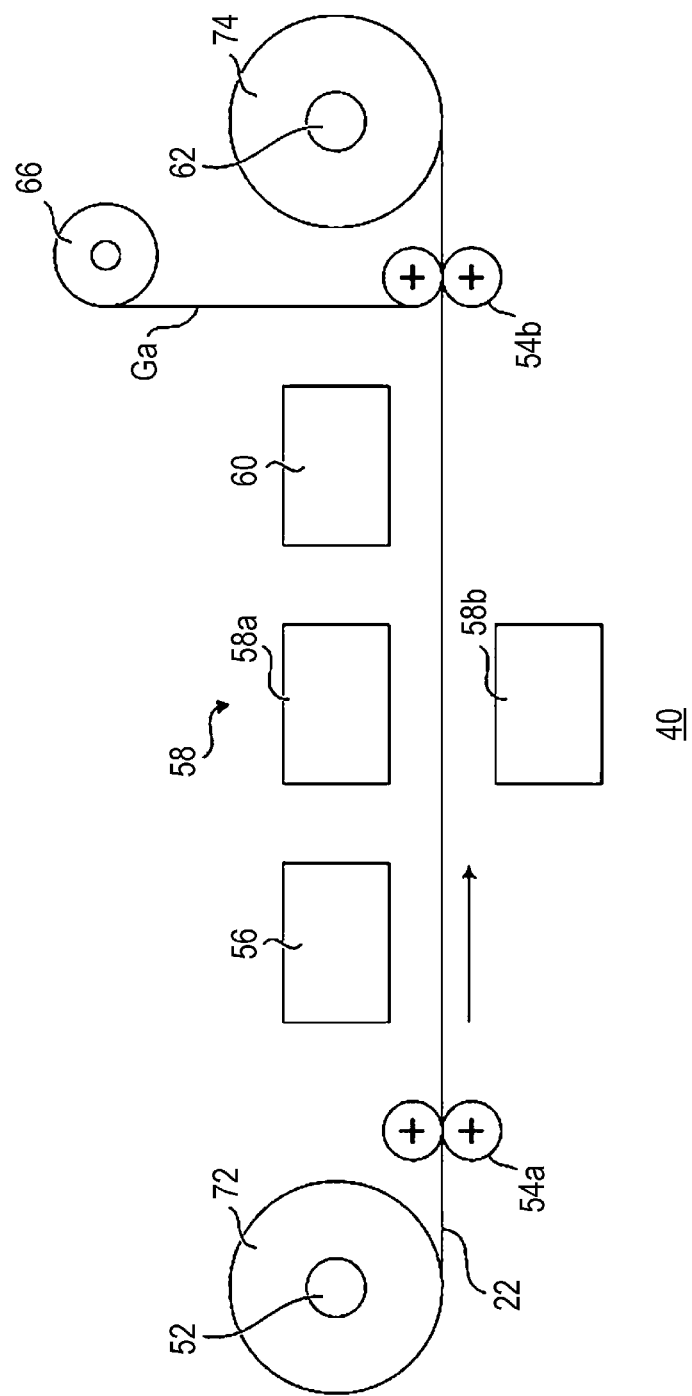
FIG. 3 schematically illustrates an example of an organic layer-forming apparatus.

FIG. 3 illustrates an organic layer-forming apparatus 40.

The organic layer-forming apparatus 40 is used for forming an underlayer by RtoR. For example, an underlayer 24 is formed. The organic layer-forming apparatus 40 includes a rotational shaft 52, transportation roller pairs 54a and 54b, a coating unit 56, a drying unit 58, a light irradiation unit 60, a winding shaft 62, and a supply roll 66.

The drying unit 58 has a drying unit 58a that performs heating from the top side (the underlayer-forming composition side, the upper side in FIG. 3) for drying and a drying unit 58b that performs heating from the back side (the support 22 side) for drying. The drying unit 58 can perform heating from both the top side and the back side.

The drying method in the drying unit 58 may be a publicly known method for heating a sheet-shaped object. For example, hot-air drying may be performed in the drying unit 58a and drying with a heat roller (a pass roller having a heating mechanism) may be performed in the drying unit 58b.

Hereafter, a method for forming an underlayer 24 using the organic layer-forming apparatus 40 will be described.

The underlayer 24 is formed by applying an underlayer-forming composition onto a long sheet A to be subjected to film formation while the long sheet A is transported in a longitudinal direction.

First, a roll 72 obtained by winding a long sheet A (support 22) is loaded on the rotational shaft 52. Then, the sheet A is unwound from the roll 72 and transported through a transportation path. The transportation path extends from the roll 72 to the winding shaft 62 through the transportation roller pair 54a, the coating unit 56, the drying unit 58, the light irradiation unit 60, and the transportation roller pair 54b in this order.

In the coating unit 56, an underlayer-forming composition is applied onto a surface of the sheet A unwound from the roll 72. Examples of the coating method in the coating unit 56 include die coating, dip coating, air knife coating, curtain coating, roller coating, wire bar coating, and gravure coating.

Subsequently, the sheet A onto which the underlayer-forming composition has been applied is heated by the drying unit 58. Thus, an organic solvent is removed from the underlayer-forming composition to dry the underlayer-forming composition.

The drying (drying process) of the underlayer-forming composition is preferably performed at 100° C. or higher. Specifically, heating is performed in the drying unit 58 such that at least one of the surface temperature of the support 22 or the temperature of the applied underlayer-forming composition is 100° C. or higher. The surface temperature of the support 22 refers to a temperature of a surface (back surface) onto which the underlayer-forming composition is not applied.

By drying the underlayer-forming composition at 100° C. or higher, the thermal shrinkage of the support 22 is saturated. As a result, the thermal shrinkage ratio of the gas barrier film reaches 2% or less, and deformation of the support 22 can be prevented in a production process that is exposed to a severe environment.

Subsequently, the sheet A is irradiated with ultraviolet rays or the like in the light irradiation unit 60. Thus, organic compounds (a graft copolymer and an acrylate monomer) are polymerized (crosslinked) to form an underlayer 24. The organic compounds may be polymerized in an inert atmosphere such as a nitrogen atmosphere, if required.

Subsequently, a protective film Ga unwound from the supply roll 66 is laminated on the underlayer 24 at the transportation roller pair 54b. The protective film Ga is a protective film that protects the underlayer 24. The sheet A on which the protective film Ga has been laminated is wound around the winding shaft 62 to obtain a roll 74.

FIG. 4 illustrates an inorganic layer-forming apparatus 80.

The inorganic layer-forming apparatus 80 is used for forming an inorganic layer by RtoR. For example, an inorganic layer 26 is formed.

The inorganic layer-forming apparatus 80 has a supply chamber 82A, a deposition chamber 82B, and a winding chamber 82C. The supply chamber 82A and the deposition chamber 82B are partitioned by a partition wall Wa having an opening Ha. The deposition chamber 82B and the winding chamber 82C are partitioned by a partition wall Wb having an opening Hb. The supply chamber 82A, the deposition chamber 82B, and the winding chamber 82C include vacuum evacuation means 84A, 84B, and 84C, respectively. By driving the vacuum evacuation means 84A, 84B, and 84C, the internal pressure of the inorganic layer-forming apparatus 80 can be controlled.

The supply chamber 82A includes a rotational shaft 92 and a pass roller 94. The deposition chamber 82B includes pass rollers 96a and 96b, collection rolls 98 and 99, a deposition unit 100, a drum 102, and a supply roll 104. The winding chamber 82C includes a pass roller 106 and a winding shaft 108.

Hereafter, a method for forming an inorganic layer 26 using the inorganic layer-forming apparatus 80 will be described.

The inorganic layer 26 is formed on the underlayer 24 of a long sheet B to be subjected to deposition while the sheet B is transported in a longitudinal direction.

First, a roll 74 is loaded on the rotational shaft 92 of the supply chamber 82A. Then, a sheet B unwound from the roll 74 is transported through a transportation path. The transportation path extends from the roll 74 of the supply chamber 82A to the winding shaft 108 of the winding chamber 82C through the drum 102 of the deposition chamber 82B.

The sheet B unwound from the roll 74 is guided by the pass roller 94 and transported to the deposition chamber 82B. The sheet B that has been transported to the deposition chamber 82B is guided by the pass roller 96a and put around the drum 102. The sheet B is processed by the deposition unit 100 while being transported through the predetermined path. Thus, an inorganic layer 26 is formed. When the sheet B has a protective film Ga, the protective film Ga is separated from the support at the pass roller 96a and collected by the collection roll 98.

Examples of the process in the deposition unit 100 include plasma CVD such as CCP-CVD or ICP-CVD. The deposition can be performed by a publicly known vapor deposition method in accordance with the inorganic layer 26 to be formed. For example, the process gases used during the deposition and the deposition conditions can be appropriately set.

The sheet B on which the inorganic layer 26 has been formed is guided by the pass roller 96b and transported to the winding chamber 82C. A protective film Gb unwound from the supply roll 104 is laminated on the inorganic layer 26 of the sheet B at the pass roller 96b. The protective film Gb is the laminate film 30 according to an embodiment of the present invention and has a resin layer 32 and an adhesive layer 34. The protective film Gb is a film for protecting the inorganic layer 26. The laminate film 30 includes a resin layer 32, an adhesive layer 34, and a release film Gc in this order at the supply roll 104. After the laminate film 30 is unwound from the supply roll 104, the release film Gc is separated from the laminate film 30 to obtain a protective film Gb. Then, the sheet B on which the protective film Gb has been laminated is wound around the winding shaft 108 to obtain a roll 110.

After the formation of the inorganic layer 26, the bonding of the laminate film 30, and the winding into a roll, all chambers of the inorganic layer-forming apparatus 80 are opened to the air and cleaned dry air is introduced into the chambers. Then, the roll 110 is taken out of the winding chamber 82C of the inorganic layer-forming apparatus 80.

For the method for producing a gas barrier film, reference can be made to the method for forming an underlayer and an inorganic layer by RtoR in JP2013-166298A.

The method for producing a gas barrier film 10 is the same as the method for producing a gas barrier film 12, except that the underlayer 24 is not formed and the inorganic layer 26 is directly formed on the support 22.

As described above, the protective film Gb is the laminate film 30 having a resin layer 32 and an adhesive layer 34. In the present invention, immediately after the inorganic layer 26 is deposited on the support 22 by plasma CVD, the laminate film 30 (protective film Gb) is bonded onto the inorganic layer 26 in a vacuum such that the adhesive layer 34 and the inorganic layer 26 face each other.

As a result of studies conducted by the present inventors, it has been found that immediately after a high-density inorganic layer 26 is formed in a vacuum by plasma CVD capable of depositing a dense inorganic layer 26, the activity of the surface of the inorganic layer 26 is considerably high and many dangling bonds are present. Therefore, it is assumed that by bonding the laminate film 30 immediately after deposition of the inorganic layer 26, components of the adhesive layer 34 of the laminate film 30 and dangling bonds of the inorganic layer 26 chemically bond to each other. When components of the adhesive layer 34 and dangling bonds of the inorganic layer 26 chemically bond to each other, the adhesion strength between the adhesive layer 34 and the inorganic layer 26 can be increased to 21 N/25 mm or more even if the adhesive layer 34 has a small thickness of 15 µm or less.

In the air, it is believed that the dangling bonds react with elements in the air and lose their activity. Therefore, in the present invention, the formation of the inorganic layer 26 (inorganic layer deposition step) and the bonding of the laminate film 30 (bonding step) are continuously performed in a vacuum. In a vacuum, there are no partners to which the dangling bonds of the inorganic layer 26 bond. Therefore, by performing the bonding step in a vacuum, the laminate film 30 (adhesive layer 34) can be bonded while a larger number of dangling bonds are left. Consequently, the components of the adhesive layer 34 can be chemically bonded to a larger number of dangling bonds. This can increase the adhesion strength between the adhesive layer 34 and the inorganic layer 26.

In the present invention, the state in a vacuum refers to a state at a pressure of 50 Pa or less.

The bonding step is preferably performed after the inorganic layer deposition step and before the sheet B on which the inorganic layer 26 has been formed comes into contact with another member such as a pass roller. If the sheet B comes into contact with a pass roller or the like after the inorganic layer deposition step, the activity of the surface of the inorganic layer 26 is sometimes lost. In particular, if the sheet B comes into contact with a member made of an organic material, components of the organic material are believed to bond to the dangling bonds of the inorganic layer 26, which decreases the number of dangling bonds. Therefore, even when the laminate film 30 is bonded to the inorganic layer 26 after that, the number of components of the adhesive layer 34 that chemically bond to the dangling bonds of the inorganic layer 26 decreases, which may inhibit an increase in the adhesion strength between the inorganic layer 26 and the adhesive layer 34. Accordingly, by performing the bonding step after the inorganic layer deposition step and before the sheet B on which the inorganic layer 26 has been formed comes into contact with another member such as a pass roller, the adhesion strength between the inorganic layer 26 and the adhesive layer 34 can be increased.

As the time elapses after the inorganic layer deposition step, the activity of the surface of the inorganic layer decreases and the number of dangling bonds left decreases. Therefore, the time from the inorganic layer deposition step to the bonding step is preferably as short as possible. Specifically, the time is preferably 20 seconds or shorter and more preferably 10 seconds or shorter.

In the inorganic layer deposition step, when a dense inorganic layer is deposited by, for example, increasing the applied voltage, the activity of the surface of the inorganic layer further increases, which probably generates a larger number of dangling bonds. Therefore, the voltage applied when the inorganic layer is deposited is preferably 2 kW or more and more preferably 4 kW or more. When the inorganic layer is deposited, a bias voltage is preferably applied. The bias voltage is preferably 0.5 kW or more and more preferably 1 kW or more.

In the bonding step, the laminate film 30 (protective film Gb) to be bonded onto the inorganic layer 26 may be wound in a roll with a release film being bonded to protect the adhesive layer 34. In the bonding step, the laminate film 30 having a release film may be bonded onto the inorganic layer 26 with the release film Gc being separated to expose the adhesive layer 34.

The bonding step in the method for producing a gas barrier film is preferably a step of bonding a protective film Gb (laminate film) obtained by separating the release film Gc from the laminate film 30 onto the inorganic layer of the sheet B.

The release film is not particularly limited. A publicly known release film that can be bonded to the adhesive layer 34 in a separable manner can be appropriately used.

Although the gas barrier film and the method for producing a gas barrier film according to embodiments of the present invention have been described in detail, the present invention is not limited to the above embodiments. Various modifications and changes can be made without departing from the scope of the present invention.

EXAMPLES

Hereafter, the present invention will be specifically described based on Examples. The present invention is not limited to specific examples below.

Example 1

Laminate Film

An A4-size ETFE film (refractive index 1.40, EF-0025 manufactured by DAIKIN INDUSTRIES, Ltd., thickness 25 μm) was provided as a resin layer 32.

Subsequently, a mixture prepared by mixing an acrylic adhesive SK-Dyne NT-21 (refractive index 1.49, containing an ultraviolet absorber) and a curing agent L45 (manufactured by Soken Chemical & Engineering Co., Ltd.) at a ratio of 95:5 was diluted with cyclohexanone to prepare a coating liquid having a solid content of 10%. The prepared coating liquid was applied onto a surface of the resin layer 32 using an applicator so as to have a dry thickness of 15 μm and dried to form an adhesive layer 34 on the resin layer 32.

Subsequently, a release film FILMBYNA BD (manufactured by FUJIMORI KOGYO Co., Ltd.) was cut to an A4 size and bonded to a surface of the adhesive layer 34 to produce a laminate film 30 (protective film Gb) having a release film.

Support

A PET film (COSMOSHINE A4300 manufactured by TOYOBO Co., Ltd., easy adhesion coating on both sides, refractive index 1.54) having a width of 1000 mm, a thickness of 100 μm, and a length of 100 m was used as a support 22.

Formation of Inorganic Layer

A capacitively coupled plasma CVD (CCP-CVD) apparatus was used as an inorganic layer-forming apparatus 80. A roll 74 obtained by winding the support 22 (sheet B) was loaded on a rotational shaft 92 in a supply chamber 82A of the inorganic layer-forming apparatus 80. The support 22 unwound from the roll 74 was transported through a transportation path. Furthermore, a supply roll 104 obtained by winding the produced protective film Gb (laminate film 30) was loaded at the predetermined position so that the protective film Gb was laminated on the inorganic layer 26 at the pass roller 96b.

The support 22 unwound from the roll 74 was transported in a longitudinal direction, and a silicon nitride film serving as an inorganic layer 26 was formed on the support 22 in the deposition chamber 82B. At the pass roller 96b, the laminate film 30 from which the release film was separated was then laminated on a surface of the inorganic layer 26. After that, the resulting film was transported to the winding chamber 82C and wound around the winding shaft 108. Thus, a gas barrier film 10 constituted by the support 22, the inorganic layer 26, the adhesive layer 34, and the resin layer 32 was produced, and the gas barrier film 10 was wound to obtain a roll 110.

Raw material gases used for forming the silicon nitride film were a silane gas (flow rate 160 sccm), an ammonia gas (flow rate 370 sccm), a hydrogen gas (flow rate 590 sccm), and a nitrogen gas (flow rate 240 sccm). The deposition pressure was 40 Pa. The power supply was a high-frequency power supply with a frequency of 13.56 MHz, and the plasma excitation power was 800 W. The formed inorganic layer 26 had a thickness of 30 nm.

The bonding of the laminate film 30 was performed after the formation of the inorganic layer and before the first pass roller contacted the film surface.

The adhesion strength between the inorganic layer 26 and the adhesive layer 34 of the produced gas barrier film 10 was 23 N/25 mm.

The adhesion strength was measured using a peel tester by a 180° peel test method conforming to JIS Z0237 (2009).

Specifically, first, the produced gas barrier film 10 was punched out with a Thomson blade to obtain a sample having a size of 100 mm×100 mm. The inorganic layer 26 and the adhesive layer 34 were peeled away from each other as follows such that the end faces were peeled away with certainty. The surface of the sample on the support 22 side was held on a sucking plate having high flatness in a sucked manner. Then, an adhesive tape (Nitto cellophane tape) having a length of 2 cm was attached to an end of the resin layer 32. Subsequently, by pulling the tape in parallel with the sample, the resin layer 32 was peeled so as to draw an arc as in the case of a 180° peel test. The peeling was performed in an environment of 25° C. and 50% RH.

Examples 2 and 3

Gas barrier films 10 in Examples 2 and 3 were produced in the same manner as in Example 1, except that the thicknesses of the adhesive layers 34 were changed to 5 μm and 1 μm, respectively.

The adhesion strength between the inorganic layer 26 and the adhesive layer 34 of the produced gas barrier film 10 was 23 N/25 mm in Example 2 and 23 N/25 mm in Example 3.

Example 4

A gas barrier film 12 was produced in the same manner as in Example 1, except that an underlayer 24 was formed on a surface of the support 22 by the following method and then the inorganic layer 26 was formed on a surface of the underlayer 24.

The adhesion strength between the inorganic layer 26 and the adhesive layer 34 of the produced gas barrier film 12 was 24 N/25 mm.

Formation of Underlayer

TMPTA (manufactured by Daicel-Cytec Ltd.) and a photopolymerization initiator (ESACURE KT046 manufactured by Lamberti) were weighed so as to have a mass ratio of 95:5. They were dissolved in methyl ethyl ketone (MEK) such that the solid content was 15 mass % to prepare an underlayer-forming composition.

The coating unit 56 of the organic layer-forming apparatus 40 was filled with the underlayer-forming composition. A roll 72 obtained by winding the support 22 into a roll was loaded on the rotational shaft 52. The support 22 unwound from the roll 72 was transported through a transportation path.

In the organic layer-forming apparatus 40, the underlayer-forming composition was applied onto the support 22 (sheet A) in a coating unit 56 and dried in a drying unit 58 while the support 22 was transported in a longitudinal direction. In the coating unit 56, a die coater was used. The heating temperature in the drying unit 58 was set to 50° C., and the passing time in the drying unit 58 was set to 3 minutes.

Subsequently, in the light irradiation unit 60, the support 22 was irradiated with ultraviolet rays (total dose: about 600 mJ/cm$^2$) to cure the underlayer-forming composition, thereby forming an underlayer 24. The support 22 on which the underlayer 24 was formed was wound around a winding shaft 62 to obtain a roll 74. The formed underlayer 24 had a thickness of 2 μm.

Example 5

A gas barrier film 12 was produced in the same manner as in Example 4, except that a protective film Ga made of PE was bonded after formation of the underlayer 24, and the protective film Ga was separated immediately before deposition of the inorganic layer 26 and the inorganic layer 26 was deposited on the underlayer 24 in the inorganic layer deposition step.

The adhesion strength between the inorganic layer 26 and the adhesive layer 34 of the produced gas barrier film 12 was 24 N/25 mm.

Example 6

A gas barrier film 12 was produced in the same manner as in Example 4, except that an underlayer 24 was formed on a surface of the support 22 by the following method and then the inorganic layer 26 was formed on a surface of the underlayer 24.

The adhesion strength between the inorganic layer 26 and the adhesive layer 34 of the produced gas barrier film 12 was 24 N/25 mm.

Formation of Underlayer

An underlayer-forming composition containing 3-glycidoxypropyltriethoxysilane and tetraethoxysilane as an alkoxysilane was prepared. First, 3-glycidoxypropyltriethoxysilane was added dropwise to a 1 wt % aqueous acetic acid solution serving as an acidic solution over three minutes while the aqueous acetic acid solution was vigorously stirred at 40° C. Subsequently, tetraethoxysilane was added to the aqueous acetic acid solution over five minutes while the aqueous acetic acid solution was vigorously stirred. Then, the mixture was continuously stirred at 40° C. for three hours to obtain an aqueous silanol solution. Subsequently, a curing agent (aluminum chelate) and a surfactant were sequentially added to the aqueous silanol solution to obtain an aqueous underlayer-forming composition. The concentration of ethanol generated in the underlayer-forming composition by hydrolysis was quantitatively determined by gas chromatography. The percentage of hydrolysis of the alkoxysilane was 99.4%. The underlayer-forming composition was applied onto a surface of the support 22 using a bar coater and dried at 175° C. for two minutes to form an underlayer 24. After a protective film Ga was laminated on a surface of the underlayer 24 at a transportation roller pair 54b, the support 22 on which the underlayer 24 was formed was wound around a winding shaft 62 to obtain a roll 74.

The underlayer had a thickness of 2 μm.

Examples 7 and 8

Gas barrier films 10 in Examples 7 and 8 were produced in the same manner as in Example 1, except that the resin layers 32 were changed to a PVDF film (DX film manufactured by Denka Company Limited, refractive index 1.46) and a PMMA film (ACRYPLEN manufactured by MITSUBISHI RAYON Co., Ltd., refractive index 1.5), respectively.

The adhesion strength between the inorganic layer 26 and the adhesive layer 34 of the produced gas barrier film 10 was 24 N/25 mm in Example 7 and 24 N/25 mm in Example 8.

Example 9

A gas barrier film 10 was produced in the same manner as in Example 1, except that a PET film (A4300 manufactured by TOYOBO Co., Ltd., refractive index 1.54) was used as the resin layer 32 and a PEN film (Q65HA manufactured by TEIJIN Limited, refractive index 1.68) was used as the support 22.

The adhesion strength between the inorganic layer 26 and the adhesive layer 34 of the produced gas barrier film 10 was 23 N/25 mm.

Examples 10 and 11

Gas barrier films 10 in Examples 10 and 11 were produced in the same manner as in Example 1, except that the thicknesses of the supports 22 were changed to 50 μm and 23 μm, respectively.

The adhesion strength between the inorganic layer 26 and the adhesive layer 34 of the produced gas barrier film 10 was 27 N/25 mm in Example 10 and 35 N/25 mm in Example 11.

Example 12

A gas barrier film 10 was produced in the same manner as in Example 1, except that the thickness of the support 22 was changed to 23 μm and the thickness of the resin layer 32 was changed to 50 μm.

The adhesion strength between the inorganic layer 26 and the adhesive layer 34 of the produced gas barrier film 10 was 35 N/25 mm.

Comparative Example 1

A gas barrier film 10 was produced in the same manner as in Example 1, except that after deposition of the inorganic layer 26, the laminate film 30 was bonded at an atmospheric pressure.

Specifically, after the deposition of the inorganic layer 26, a release film made of PE was bonded onto the inorganic layer 26 and winding into a roll was performed. The roll was unwound, and the laminate film 30 was bonded onto the inorganic layer 26 using a typical RtoR laminating apparatus with the release film being separated.

The adhesion strength between the inorganic layer 26 and the adhesive layer 34 of the produced gas barrier film 10 was 17 N/25 mm.

Comparative Examples 2 and 3

Gas barrier films in Comparative Examples 2 and 3 were produced in the same manner as in Comparative Example 1, except that the thicknesses of the adhesive layers 34 were changed to 5 µm and 1 µm, respectively.

The adhesion strength between the inorganic layer 26 and the adhesive layer 34 of the produced gas barrier film 10 was 16 N/25 mm in Comparative Example 2 and 15 N/25 mm in Comparative Example 3.

Comparative Example 4

A gas barrier film 10 was produced in the same manner as in Example 1, except that the thickness of the adhesive layer 34 was changed to 50 µm.

The adhesion strength between the inorganic layer 26 and the adhesive layer 34 of the produced gas barrier film 10 was 15 N/25 mm.

Comparative Example 5

A gas barrier film 10 was produced in the same manner as in Example 1, except that the thickness of the adhesive layer 34 was changed to 30 µm, the thickness of the support 22 was changed to 23 µm, and the thickness of the resin layer 32 was changed to 50 µm.

The adhesion strength between the inorganic layer 26 and the adhesive layer 34 of the produced gas barrier film 10 was 15 N/25 mm.

Comparative Example 6

A gas barrier film 10 was produced in the same manner as in Example 1, except that the mixing ratio of an adhesive agent and a curing agent was changed to 99.9:0.1 to decrease the adhesive strength.

The adhesion strength between the inorganic layer 26 and the adhesive layer 34 of the produced gas barrier film 10 was 17 N/25 mm.

Comparative Example 7

A gas barrier film 10 was produced in the same manner as in Example 1, except that the mixing ratio of an adhesive agent and a curing agent was changed to 70:30 to increase the adhesive strength.

The adhesion strength between the inorganic layer 26 and the adhesive layer 34 of the produced gas barrier film 10 was 64 N/25 mm.

The following measurements were performed for the produced gas barrier films.

Gas Barrier Properties

A sample was cut out from the produced gas barrier film, and the water vapor transmission rate was measured by a calcium corrosion method to evaluate the gas barrier properties. The constant temperature and humidity treatment was performed at a temperature of 40° C. and a relative humidity of 90% RH.

Light-Transmitting Property

The total light transmittance of the produced gas barrier film was measured in conformity with JIS K7361 (1997) using SH-7000 manufactured by NIPPON DENSHOKU INDUSTRIES Co., Ltd. to evaluate the light-transmitting property.

Haze

The haze of the produced gas barrier film was measured in conformity with JIS K7136 (2000) using SH-7000 manufactured by NIPPON DENSHOKU INDUSTRIES Co., Ltd. to evaluate the haze.

Scratch Resistance

After the produced gas barrier film was rubbed with a sapphire needle from the resin layer side, the gas barrier properties were measured by the above method to evaluate the scratch resistance.

The sapphire needle rubbing test was performed in conformity with JIS K5600-5-5 using a 0.1 mm sapphire needle. The sapphire needle rubbing test was performed at a load of 20 g.

Tables 1 to 3 below show the configuration and evaluation results of the gas barrier films in Examples 1 to 12 and Comparative Examples 1 to 7.

TABLE 1

|  |  | Example 1 | Example 2 | Example 3 | Example 4 | Example 5 | Example 6 |
|---|---|---|---|---|---|---|---|
| Support | Material | PET A4300 (easy adhesion coating on both sides) | PET A4300 (easy adhesion coating on both sides) | PET A4300 (easy adhesion coating on both sides) | PET A4300 (easy adhesion coating on both sides) | PET A4300 (easy adhesion coating on both sides) | PET A4300 (easy adhesion coating on both sides) |
|  | Thickness | 100 µm | 100 µm | 100 µm | 100 µm | 100 µm | 100 µm |
| Underlayer | Material | — | — | — | TMPTA | TMPTA | alkoxysilane |
|  | Thickness | — | — | — | 2 | 2 | 2 |
| Inorganic layer | Material | SiN | SiN | SiN | SiN | SiN | SiN |
|  | Thickness | 30 nm | 30 nm | 30 nm | 30 nm | 30 nm | 30 nm |
| Adhesive layer | Material | Acrylic | Acrylic | Acrylic | Acrylic | Acrylic | Acrylic |
|  | Thickness | 15 µm | 5 µm | 1 µm | 15 µm | 15 µm | 15 µm |
| Resin layer | Material | ETFE | ETFE | ETFE | ETFE | ETFE | ETFE |
|  | Thickness | 25 µm | 25 µm | 25 µm | 25 µm | 25 µm | 25 µm |
| Adhesion strength between inorganic layer and adhesive layer | | 23 N/25 mm | 23 N/25 mm | 23 N/25 mm | 24 N/25 mm | 24 N/25 mm | 24 N/25 mm |
| Production method | Inorganic layer deposition step and Bonding step | Continuously performed in vacuum | Continuously performed in vacuum | Continuously performed in vacuum | Continuously performed in vacuum | Continuously performed in vacuum | Continuously performed in vacuum |
|  | Release film for underlayer | — | — | — | — | PE 30 µm | PE 30 µm |
|  | Release film for inorganic layer | — | — | — | — | — | — |
| Evaluation | Water vapor transmission rate | $2 \times 10^{-2}$ | $2 \times 10^{-2}$ | $2 \times 10\text{-}2$ | $2 \times 10^{-3}$ | $1 \times 10^{-4}$ | $1 \times 10^{-4}$ |
|  | Total light transmittance | 91% | 91% | 91% | 92% | 92% | 92% |

TABLE 1-continued

|  |  | Example 1 | Example 2 | Example 3 | Example 4 | Example 5 | Example 6 |
|---|---|---|---|---|---|---|---|
|  | Haze | 2.3% | 1.6% | 1.3% | 2.4% | 2.4% | 2.4% |
|  | Scratch resistance | No deterioration | No deterioration | No deterioration | No deterioration | No deterioration | No deterioration |

TABLE 2

|  |  | Example 7 | Example 8 | Example 9 | Example 10 | Example 11 | Example 12 |
|---|---|---|---|---|---|---|---|
| Support | Material | PET A4300 (easy adhesion coating on both sides) | PET A4300 (easy adhesion coating on both sides) | PEN Q65HA (easy adhesion coating on one side) | PET A4300 (easy adhesion coating on both sides) | PET A4300 (easy adhesion coating on both sides) | PET A4300 (easy adhesion coating on both sides) |
|  | Thickness | 100 μm | 100 μm | 100 μm | 50 μm | 23 μm | 23 μm |
| Underlayer | Material | — | — | — | — | — | — |
|  | Thickness | — | — | — | — | — | — |
| Inorganic layer | Material | SiN | SiN | SiN | SiN | SiN | SiN |
|  | Thickness | 30 nm | 30 nm | 30 nm | 30 nm | 30 nm | 30 nm |
| Adhesive layer | Material | Acrylic | Acrylic | Acrylic | Acrylic | Acrylic | Acrylic |
|  | Thickness | 15 μm | 15 μm | 15 μm | 15 μm | 15 μm | 15 μm |
| Resin layer | Material | PVDF | PMMA | PET | ETFE | ETFE | ETFE |
|  | Thickness | 30 μm | 30 μm | 25 μm | 25 μm | 25 μm | 50 μm |
|  | Adhesion strength between inorganic layer and adhesive layer | 24 N/25 mm | 24 N/25 mm | 23 N/25 mm | 27 N/25 mm | 35 N/25 mm | 35 N/25 mm |
| Production method | Inorganic layer deposition step and Bonding step | Continuously performed in vacuum | Continuously performed in vacuum | Continuously performed in vacuum | Continuously performed in vacuum | Continuously performed in vacuum | Continuously performed in vacuum |
|  | Release film for underlayer | — | — | — | — | — | — |
|  | Release film for inorganic layer | — | — | — | — | — | — |
| Evaluation | Water vapor transmission rate | $2 \times 10^{-2}$ | $2 \times 10^{-2}$ | $2 \times 10^{-2}$ | $1.9 \times 10^{-2}$ | $1.9 \times 10^{-2}$ | $1.9 \times 10^{-2}$ |
|  | Total light transmittance | 91% | 90% | 89% | 91.4% | 92.1% | 92.1% |
|  | Haze | 2.3% | 2.3% | 2.3% | 2.3% | 2.3% | 2.3% |
|  | Scratch resistance | No deterioration | No deterioration | No deterioration | No deterioration | No deterioration | No deterioration |

TABLE 3

|  |  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
| Support | Material | PET A4300 (easy adhesion coating on both sides) | PET A4300 (easy adhesion coating on both sides) | PET A4300 (easy adhesion coating on both sides) | PET A4300 (easy adhesion coating on both sides) | PET A4300 (easy adhesion coating on both sides) | PET A4300 (easy adhesion coating on both sides) | PET A4300 (easy adhesion coating on both sides) |
|  | Thickness | 100 μm | 100 μm | 100 μm | 100 μm | 23 μm | 100 μm | 100 μm |
| Underlayer | Material | — | — | — | — | — | — | — |
|  | Thickness | — | — | — | — | — | — | — |
| Inorganic layer | Material | SiN | SiN | SiN | SiN | SiN | SiN | SiN |
|  | Thickness | 30 nm | 30 nm | 30 nm | 30 nm | 30 nm | 30 nm | 30 nm |
| Adhesive layer | Material | Acrylic | Acrylic | Acrylic | Acrylic | Acrylic | Acrylic, Curing agent in small amount | Acrylic, Curing agent in large amount |
|  | Thickness | 15 μm | 5 μm | 1 μm | 50 μm | 30 μm | 15 μm | 15 μm |
| Resin layer | Material | ETFE | ETFE | ETFE | ETFE | ETFE | ETFE | ETFE |
|  | Thickness | 30 μm | 30 μm | 30 μm | 25 μm | 50 μm | 25 μm | 25 μm |
|  | Adhesion strength between inorganic layer and adhesive layer | 17 N/25 mm | 16 N/25 mm | 15 N/25 mm | 15 N/25 mm | 15 N/25 mm | 17 N/25 mm | 64 N/25 mm |
| Production method | Inorganic layer deposition step and Bonding step | Bonding step at atmospheric pressure | Bonding step at atmospheric pressure | Bonding step at atmospheric pressure | Continuously performed in vacuum | Continuously performed in vacuum | Continuously performed in vacuum | Continuously performed in vacuum |
|  | Release film for underlayer | — | — | — | — | — | — | — |
|  | Release film for inorganic layer | PE | PE | PE | — | — | — | — |
| Evaluation | Water vapor transmission rate | $2 \times 10^{-2}$ | $2 \times 10^{-2}$ | $2 \times 10^{-2}$ | $2 \times 10^{-1}$ | $2 \times 10^{-1}$ | $1 \times 10^{-1}$ | $1.1 \times 10^{-1}$ |
|  | Total light transmittance | 91% | 91% | 91% | 84% | 84% | 91% | 91% |

TABLE 3-continued

|  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Haze | 3.5% | 4.8% | 5.5% | 4.5% | 3.0% | 2.5% | 2.4% |
| Scratch resistance | No deterioration | No deterioration | No deterioration | No deterioration | No deterioration | Deteriorated through separation | Deteriorated through wrinkling |

As is clear from Tables 1 to 3, the gas barrier films in Examples of the present invention have better gas barrier properties, higher total light transmittance, lower haze, and higher scratch resistance than those in Comparative Examples.

The comparison of Examples 1 to 3 shows that the haze decreases as the thickness of the adhesive layer decreases.

The comparison between Example 1 and Examples 4 to 6 shows that the presence of the underlayer improves the gas barrier properties (decreases the water vapor transmission rate).

It is found from Example 1 and Examples 7 to 9 that various resin materials can be used for the resin layer.

The comparison of Example 1, Example 10, and Example 11 shows that the total light transmittance increases as the thickness of the support decreases.

In contrast, in Comparative Examples 1 to 3, the adhesion strength between the inorganic layer and the adhesive layer is low. Therefore, the air enters a portion between the inorganic layer and the adhesive layer, which deteriorates the haze.

In Comparative Examples 4 and 5, the thickness of the adhesive layer is excessively large and thus the total light transmittance is low and the haze is high. Furthermore, if the thickness of the adhesive layer is excessively large, the cohesive separation of the adhesive layer is caused, which breaks the inorganic layer. This also increases the water vapor transmission rate.

From the above results, the advantageous effects of the present invention are obvious.

REFERENCE SIGNS LIST 10, 12 gas barrier film
22 support
24 underlayer
26 inorganic layer
30 laminate film
32 resin layer
34 adhesive layer
40 organic layer-forming apparatus
52, 92 rotational shaft
54a, 54b transportation roller pair
56 coating unit
58, 58a, 58b drying unit
60 light irradiation unit
62, 108 winding shaft
66, 104 supply roll
72, 74, 110 roll
80 inorganic layer-forming apparatus
82 vacuum chamber
82A supply chamber
82B deposition chamber
82C winding chamber
84A to 84C vacuum evacuation means
94, 96a, 96b, 106 pass roller
98, 99 collection roll
100 deposition unit
102 drum

What is claimed is:

1. A gas barrier film comprising, in sequence:
a support;
an inorganic layer disposed on one surface side of the support;
an adhesive layer disposed on a surface of the inorganic layer; and
a resin layer disposed on a surface of the adhesive layer,
wherein the adhesive layer and the inorganic layer chemically bond to each other,
the adhesive layer has a thickness d1 of 15 μm or less, and
an adhesion strength between the inorganic layer and the adhesive layer is 21 N/25 mm or more and 60 N/25 mm or less.

2. The gas barrier film according to claim 1, wherein a refractive index n2 of the resin layer and a refractive index n3 of the support satisfy a relationship of n2<n3.

3. The gas barrier film according to claim 1, wherein a thickness d2 of the resin layer and the thickness d1 of the adhesive layer satisfy a relationship of d1<d2.

4. The gas barrier film according to claim 1, wherein a thickness d3 of the support and the thickness d1 of the adhesive layer satisfy a relationship of d1<d3.

5. The gas barrier film according to claim 1, wherein the gas barrier film has a haze of 3% or less.

6. The gas barrier film according to claim 1, wherein the refractive index n2 of the resin layer is 1.38 or more and 1.65 or less.

7. The gas barrier film according to claim 1, wherein the resin layer contains a fluorocarbon resin.

8. The gas barrier film according to claim 1,
wherein the adhesive layer includes at least one of acrylic, silicone, or urethane, and
a refractive index n1 of the adhesive layer is 1.38 or more and 1.65 or less.

9. The gas barrier film according to claim 3,
wherein the adhesive layer includes at least one of acrylic, silicone, or urethane, and
a refractive index n1 of the adhesive layer is 1.38 or more and 1.65 or less.

10. The gas barrier film according to claim 6,
wherein the adhesive layer includes at least one of acrylic, silicone, or urethane, and
a refractive index ni of the adhesive layer is 1.38 or more and 1.65 or less.

11. The gas barrier film according to claim 7,
wherein the adhesive layer includes at least one of acrylic, silicone, or urethane, and
a refractive index n1 of the adhesive layer is 1.38 or more and 1.65 or less.

12. The gas barrier film according to claim 1, further comprising an underlayer between the support and the inorganic layer.

13. The gas barrier film according to claim 1, wherein at least one of the adhesive layer, the resin layer, or the support contains an ultraviolet absorber.

14. The gas barrier film according to claim 1, further comprising an underlayer between the support, and the inorganic layer
wherein at least one of the adhesive layer, the resin layer, or the support contains an ultraviolet absorber,
the resin layer contains a fluorocarbon resin,
the adhesive layer includes at least one of acrylic, silicone, or urethane,
a refractive index n1 of the adhesive layer is 1.38 or more and 1.65 or less,
the refractive index n2 of the resin layer is 1.38 or more and 1.65 or less,
a refractive index n2 of the resin layer and a refractive index n3 of the support satisfy a relationship of n2<n3,
a thickness d2 of the resin layer and the thickness d1 of the adhesive layer satisfy a relationship of d1<d2,
a thickness d3 of the support and the thickness d1 of the adhesive layer satisfy a relationship of d1<d3, and
the gas barrier film has a haze of 3% or less.

15. A method for producing the gas barrier film of claim 1, comprising, in a vacuum:
an inorganic layer deposition step of depositing an inorganic layer on one surface side of a support by plasma chemical vapor deposition (CND); and
immediately after the inorganic layer deposition step, a bonding step of bonding a laminate film having an adhesive layer and a resin layer onto the inorganic layer such that the adhesive layer and the inorganic layer face each other.

16. The method for producing a gas barrier film according to claim 15, wherein the inorganic layer deposition step and the bonding step are performed in a vacuum while a second support is transported in a longitudinal direction.

17. The method for producing a gas barrier film according to claim 15, further comprising:
an underlayer formation step of forming an underlayer on the support,
wherein in the inorganic layer deposition step, an inorganic layer is deposited on a surface of the underlayer by plasma CVD.

18. The method for producing a gas barrier film according to claim 15,
wherein the laminate film further has a release film disposed on a surface thereof on the adhesive layer side, and
in the bonding step, the laminate film is bonded onto the inorganic layer with the release film being separated.

* * * * *